United States Patent
Schedel et al.

(10) Patent No.: US 6,887,722 B2
(45) Date of Patent: May 3, 2005

(54) METHOD FOR EXPOSING A SEMICONDUCTOR WAFER

(75) Inventors: Thorsten Schedel, Dresden (DE); Torsten Seidel, Dresden (DE)

(73) Assignee: Infineon Technologies SC300 GmbH & Co. KG, Dresden (DE)

( * ) Notice: Subject to any disclaimer, the term of this patent is extended or adjusted under 35 U.S.C. 154(b) by 164 days.

(21) Appl. No.: 10/435,449

(22) Filed: May 9, 2003

(65) Prior Publication Data

US 2004/0029027 A1 Feb. 12, 2004

Related U.S. Application Data

(63) Continuation of application No. PCT/EP01/12237, filed on Oct. 23, 2001.

(30) Foreign Application Priority Data

Nov. 9, 2000 (EP) .............................................. 00124564

(51) Int. Cl.[7] ............................................ H01L 21/302
(52) U.S. Cl. .............................. 438/7; 438/16; 438/946; 430/5; 430/30
(58) Field of Search ........................... 430/5, 30; 438/7, 438/16, 946

(56) References Cited

U.S. PATENT DOCUMENTS

| 4,500,615 | A | | 2/1985 | Iwai |
| 5,646,870 | A | * | 7/1997 | Krivokapic et al. ........... 716/4 |
| 6,689,519 | B2 | * | 2/2004 | Brown et al. .................. 430/30 |

FOREIGN PATENT DOCUMENTS

| JP | 58156938 | | 9/1983 |
| JP | 03211820 | | 9/1991 |
| JP | 2000-100701 | * | 4/2000 |
| TW | 396433 | | 7/2000 |

* cited by examiner

*Primary Examiner*—George A. Goudreau
(74) *Attorney, Agent, or Firm*—Laurence A. Greenberg; Werner H. Stemer; Gregory L. Mayback

(57) ABSTRACT

A method for exposing a semiconductor wafer compensates for the effects of process inhomogeneities, e.g. in semiconductor etching or deposition processes, by individually adjusting sets of exposure parameters of an exposure tool for any exposure field. The exposure parameters are preferably the dose and the focus, which are varied across the semiconductor wafer.

7 Claims, 7 Drawing Sheets

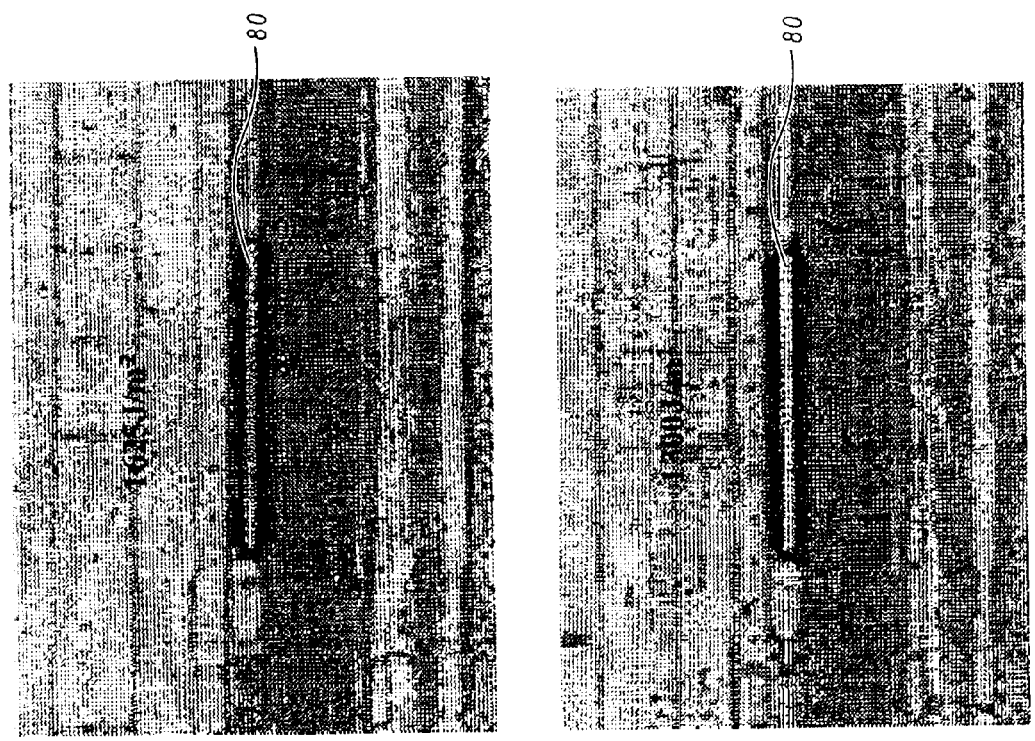
FIG 6
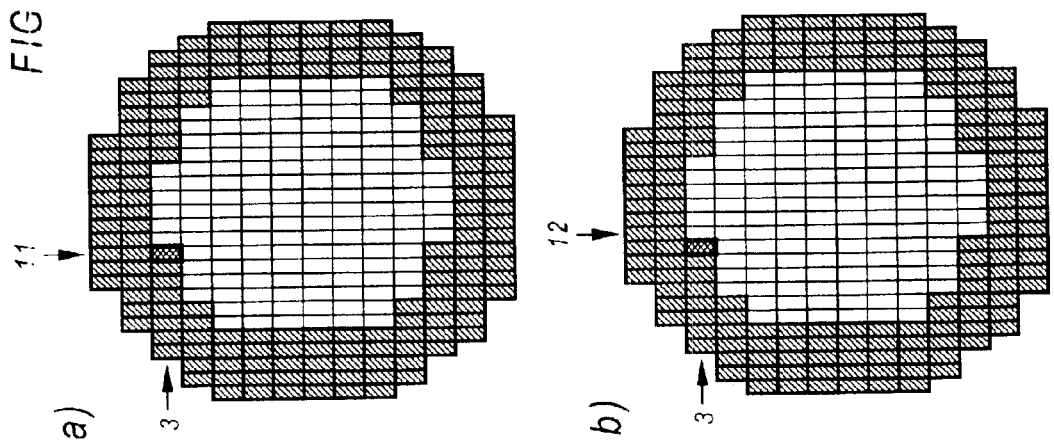

METHOD FOR EXPOSING A SEMICONDUCTOR WAFER

CROSS-REFERENCE TO RELATED APPLICATION

This application is a continuation of copending International Application No. PCT/EP01/12237, filed Oct. 23, 2001, which designated the United States and was published in English.

BACKGROUND OF THE INVENTION

Field of the Invention

This invention relates to a method for exposing a semiconductor wafer.

In semiconductor wafer manufacturing, the maintenance of homogeneous process conditions plays an important role for guaranteeing a high wafer output yield and for reducing the amount of time spent in rework. With the advances to larger wafer sizes, process-dependent inhomogeneities during, e.g., developing, etching, oxidation or cleaning processes can become particularly prominent in the case of wafers having diameters of 300 millimeters or larger and may result in the non-uniformity of length scales, such as, linewidths, layer thicknesses or the pattern quality across the wafer field. It is common for all process parameters, e.g. etch parameters, to be adjusted, such that a maximum number of uniformity measurements fall just within given tolerance ranges. Alternatively, a decreased chip yield can even be accepted.

A related problem arises from inhomogeneities in the layer thicknesses of plasmaoxide ($SiO_2$) and plasmanitride ($Si_3N_4$) double layers after the final passivation process of wafer manufacturing. These layers are produced in a plasma enhanced chemical vapor deposition process (PECVD) and serve for impeding the penetration of water or contaminating materials to the metal lines just beneath. If many process steps will be performed as in the case of memory or logic products, a complex surface structure can emerge prior to passivation resulting in an inevitable thickness fluctuation after passivation.

The deposition process can introduce smooth large scale variations, i.e. a decrease of thickness, from the center of the wafer to the outer edge due to the inhomogeneities in the plasma deposition. After depositing the passivation layers, the surface is then coated with imid resist in order to be exposed to light through a patterned mask. The pattern is commonly designed, such that fuses, which will be laser-cut after testing in order to cut-off redundancies, are exposed to light. Having a resist, the imid is developed and hard-baked, and the passivation layer beneath can be etched away. The fuses are then accessible by an external laser spot.

The light emerging from the exposure tool, e.g. a wafer stepper, penetrates through the imid layer and is reflected by the underlying passivation layer with a reflectivity, e.g., of up to 20%. Unfortunately, the reflectivity varies strongly with the passivation layer thickness caused by interference of light reflected at different layer boundaries. Consequently, the center-edge variation of passivation layer thicknesses due to deposition process inhomogeneities result in resist residues in the fuses at the outer wafer edge. Thus, these fuses are not accessible by an external laser spot.

The problem can be cured by reworking the wafers in concern, thereby performing an additional etch process in order to remove the resist residues, but the same etch process may affect other layers as well, which results in degradation. Moreover, rework prolongs the total cycle time of wafers and consumes expensive machine and operator resources. In any case the wafer yield will be decreased due to the decreased process quality.

SUMMARY OF THE INVENTION

It is accordingly an object of the invention to provide a method for exposing a semiconductor wafer, which overcomes the above-mentioned disadvantages of the prior art methods of this general type.

In particular, it is an object of the invention to provide a method that reduces the amount of a rework due to process inhomogeneities and increases the yield in semiconductor manufacturing processes.

With the foregoing and other objects in view there is provided, in accordance with the invention, a method for exposing a semiconductor wafer by adjusting exposure parameters of an exposure tool and projecting a pattern of a matrix configuration of exposure fields on the semiconductor wafer. The method includes steps of: in a first step, dividing the matrix configuration of exposure fields into at least two areas, providing a plurality of sets of exposure parameters including a dose and a focus of the exposure tool, and correlating each of the areas with a different one of the plurality of sets of exposure parameters; in a second step, exposing each one of the exposure fields using a respective one of the plurality of sets of exposure parameters correlated with a respective one of the areas associated with the one of the exposure fields; performing the first step and the second step on the semiconductor wafer, which has been coated with a passivation layer and a resist configured on the passivation layer; and providing each one of the plurality of sets of exposure parameters in accordance with a property of the passivation layer underlying the resist.

In accordance with an added feature of the invention, the second step is repeated for a plurality of semiconductor wafers such that an extent and a design of the areas and the plurality of sets of exposure parameters respectively associated with the exposure fields are held constant for all of the plurality of semiconductor wafers.

In accordance with an additional feature of the invention, the step of dividing the matrix configuration into the areas is performed by: first, determining for each one of the exposure fields, ranges of a multiplicity of sets of exposure parameters enabling an exposure to achieve a given quality; and second, associating each one of the exposure fields with a respective one of the areas such that all of the exposure parameters associated with the one of the exposure fields are within the ranges of the multiplicity of sets of exposure parameters.

In accordance with another feature of the invention, the exposure tool is a wafer stepper or scanner.

In accordance with a further feature of the invention, the exposure tool is an electron beam lithography tool, a laser beam lithography tool, an ion projection beam lithography tool, or an x-ray lithography tool.

In accordance with a further added feature of the invention, the method includes: providing the areas as a continuous outer edge area and a continuous inner area of the semiconductor wafer; providing a circle separating inner area ones of the exposure fields from outer area ones of the exposure fields; and providing the circle with an adjustable radius.

In accordance with yet an added feature of the invention, the method includes providing the semiconductor wafer with a diameter of at least 300 millimeters.

In other words, the problem is solved by a method for exposing a semiconductor wafer by adjusting exposure parameters of an exposure tool and projecting a pattern into an matrix configuration of exposure fields on the semiconductor wafer, including a first step, where the matrix configuration of exposure fields is divided into at least two areas, each of the areas being provided with a different set of exposure parameters including the dose and the focus of an exposure tool, and a second step, where each exposure field is exposed using the set of exposure parameters, which is attached to the area associated to the exposure field.

Using the method, the aforementioned chemical or physical process inhomogeneities can advantageously be compensated within the lithographic step without the need for changing the process itself. This is accomplished by varying the exposure parameters of an exposure tool between the different exposure steps of one wafer, where the pattern is projected stepwise onto the exposure fields of the wafer. A locally acting inhomogeneity in a process other than the lithographic step itself can be outweighed by the change in the exposure parameter for the local exposure, if both features, the efficiency of the process and a change in exposure counteract or act similarly the same measurable output quantity, like critical dimension etc.

The common matrix configuration of exposure fields is divided into a number of areas, which are treated differently in the choice of exposure parameters—instead of using just one set of parameters for all exposure steps of a wafer. The size and the extent of the areas depend on what kind of inhomogeneity is to be compensated. Preferably, the geometries of the process inhomogeneities are reflected in the form of the areas. Typically used forms will be strips extending across the wafer in parallel, which are orientated orthogonally to a gradient of some quantity on the wafer, which has to be compensated, or concentric circles reflecting processes acting insufficiently at the wafer edges. Thus, the method can advantageously be adapted to the dimension of any process inhomogeneity.

As an example, a lithographic lead can be inserted to compensate for local variations of etch processes on the wafer, by, e.g., increasing the dose for the corresponding exposure fields with an inefficient etch process. In the case of projecting a chrome bar from a reticle to the wafer and using a positive resist, an increased dose results in smaller linewidths, thereby compensating the weak etching of line profiles in an inefficient etch process at the outer wafer edges, and vice versa. Also the focus or any other adjustable parameter of a lithographic tool can be varied in order to compensate for problems occurring in the processes other than lithography.

The determination of the areas and their exposure parameters can be performed either by a simulation of the whole process, where a compensation has to be applied, or a first test wafer can be started, where in neighboring columns or rows of the exposure field matrix the exposure parameters are slightly varied, and—after processing—are analyzed. An external input of area and exposure parameter treatment is possible, such as a readjusting input by a control measurement in a closed loop control circuit. Since even in the prior art case, a determination of exposure parameters is also performed by starting a test wafer, few additional efforts have to be spent in determining the areas and their exposure parameters. Thus, wafer cycletime is saved while additional setup time for the exposure tool is negligible.

The detail of desired compensation on the wafer field can be raised up to the resolution of one exposure field, i.e. one area is equal to one exposure field. In the case e-beam- or ion-projection beam writers one exposure field corresponds to just one address grid point covering just a few nanometers in diameter.

Once the areas and their exposure parameters are known, the desired mask pattern is projected onto the wafer step by step into the exposure fields of the matrix structure. Each exposure step is conducted with the exposure parameters that have previously been attached to the area corresponding to the exposure field currently being exposed. So if a relation between the process efficiency and the exposure parameter compensation is available, systematic variations on the wafer, such as, the center-edge variations across the wafer, which usually result in linewidth gradients, defect density gradients, and increased resist residue occurrences in outer edge areas of the wafer, can be compensated, thus increasing the wafer yield and decreasing the amount of rework.

Another advantage resides in an exposure after a final passivation process. If the method is applied to wafers after this process, using a dose in the central parts of the wafer as in the prior art case and using an increased dose in the outer edge areas of the wafer, the decreased illumination of the imid layer in the outer edge parts due to the decreased reflectivity of the underlying passivation layer consisting of plasmaoxide and plasmanitride, can be compensated by the higher intensity due to the higher dose. Thus, any exposed region across the wafer receives the same intensity of exposure light. Therefore, no resist residue remains on the wafer surface, especially in fuses, and the wafer yield is advantageously increased.

A further advantageous aspect considers the mass-production of semiconductor wafers. Once the areas and the exposure parameter that has been determined to compensate for process inhomogeneities, are known, they can be held constant for all subsequent semiconductor wafers receiving the same pattern, and which run through the same process. No additional setup or parameter determination is necessary, thus saving time while still increasing the wafer yield.

A further aspect considers the concept of areas. Usually, the matrix of exposure fields that will be projected onto the wafer can be visualized by a so-called litho-shot map. For the purpose of simplicity, exposure fields that would have individual exposure parameter settings in order to achieve an optimal output quality, are combined into areas. The process windows of each exposure field, defined as a combination of exposure parameter ranges that guarantee a high quality output, are used to group together the exposure fields that include overlapping process windows. The resulting areas then include exposure parameters, which are still positioned within the process window of any exposure field that belongs to the considered area. The advantage of this concept is that this litho-shot map, reflecting the matrix of exposure fields and showing the areas, still provides high quality and can quickly be reused and refined for the next wafer lot. According to the present invention any geometrical structure of these areas can be implemented.

Another advantageous aspect considers the application of the present invention to future generation lithography tools for exposing a semiconductor wafer. While, e.g., the dose and the focus exposure parameters can easily be varied between the exposure steps of optical, extended ultraviolet or x-ray lithography tools, the same is valid if the pattern is written onto the wafer by any kind of beam, i.e. ion-, electron-, x-ray-beam, etc. In this case there is even the possibility that the respective beam dose can be varied within one exposure step, just depending on the coordinates, that are currently spotted by the beam. The compensation of process inhomogeneities can be particularly advantageous therein.

A further advantageous aspect of the present invention is the use of predefined geometrical forms of the aforementioned areas. The preferred application of the present invention is the compensation of center-edge variations of process parameters across the wafers. Using a central area, e.g., including all exposure fields up to a radius, which can be varied, and combining the remaining outer exposure fields into an outer edge area having an annular form, the variations can be compensated to a first order. Since the geometry of the process inhomogeneity is fully reflected in these areas and just the exposure fields in the border of the central area given by the radius will be investigated, the procedure of determining areas and the exposure parameters becomes even more efficient and time saving.

A further aspect of the present invention deals with the problems of 300 millimeter or larger wafer technology. Since with larger wafer sizes, process inhomogeneities become particularly prominent, the method significantly reduces the amount of rework and increases the wafer yield.

Other features which are considered as characteristic for the invention are set forth in the appended claims.

Although the invention is illustrated and described herein as embodied in a method for exposing a semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6A displays the quality of fuses of neighboring exposure fields at an outer edge area exposure field at the border shown in FIG. 3;

FIG. 6B displays the quality of fuses of neighboring exposure fields at an inner circle area exposure field at the border shown in FIG. 3.

DESCRIPTION OF THE PREFERRED EMBODIMENTS

An embodiment of the inventive method will now be described with respect to the aforementioned problem of reflectivity variation across the wafer.

Figure 1:
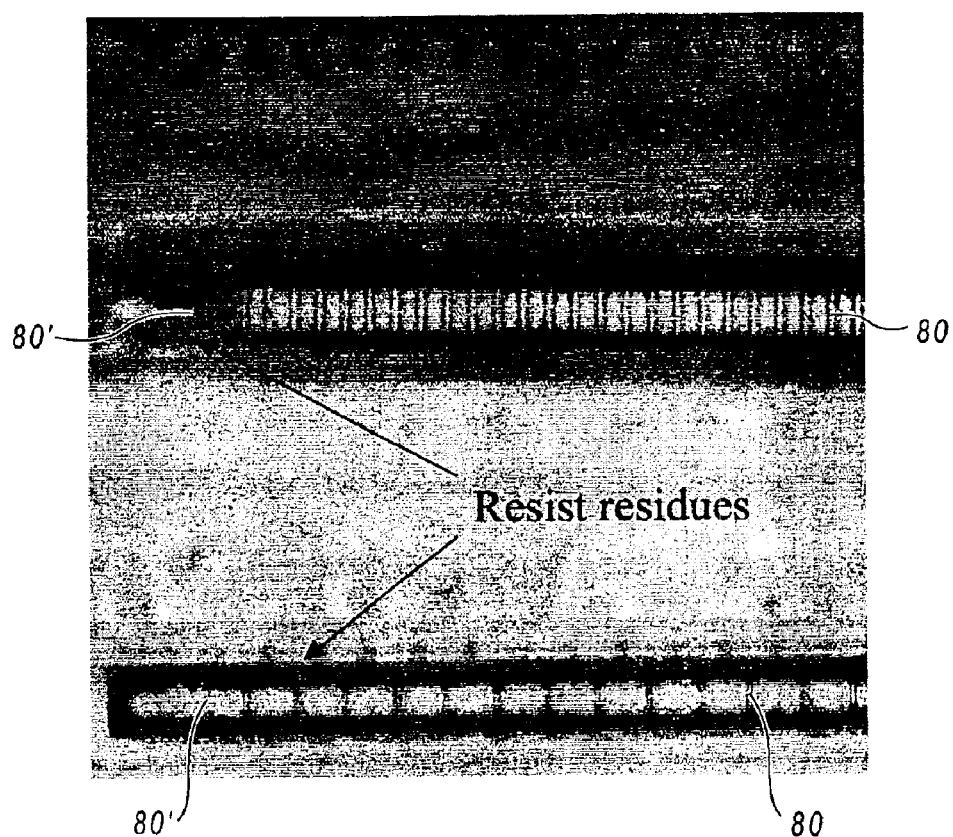
FIG. 1 is an image of sets of fuses on a memory chip that are partly covered by resist residue.

Referring now to the figures of the drawing in detail and first, particularly, to FIG. 1 thereof, there is shown a scanning electron microscope image of two horizontal bars on a memory chip of an exposed wafer containing a plurality of fuses 80 that are visible as short vertical lines inside the bars. The chip displayed in FIG. 1 is positioned in an exposure field at the outer edge of the wafer, where the method of this invention has not yet been applied. For the exposure, exposure parameters had been chosen that provide high quality output in the central wafer field. Due to the aforementioned process variations across the wafer, resist residues remain on the wafer surface after developing and cleaning, which cover several fuses 80' that are poorly visible on the left-hand side of FIG. 1.

Figure 2:
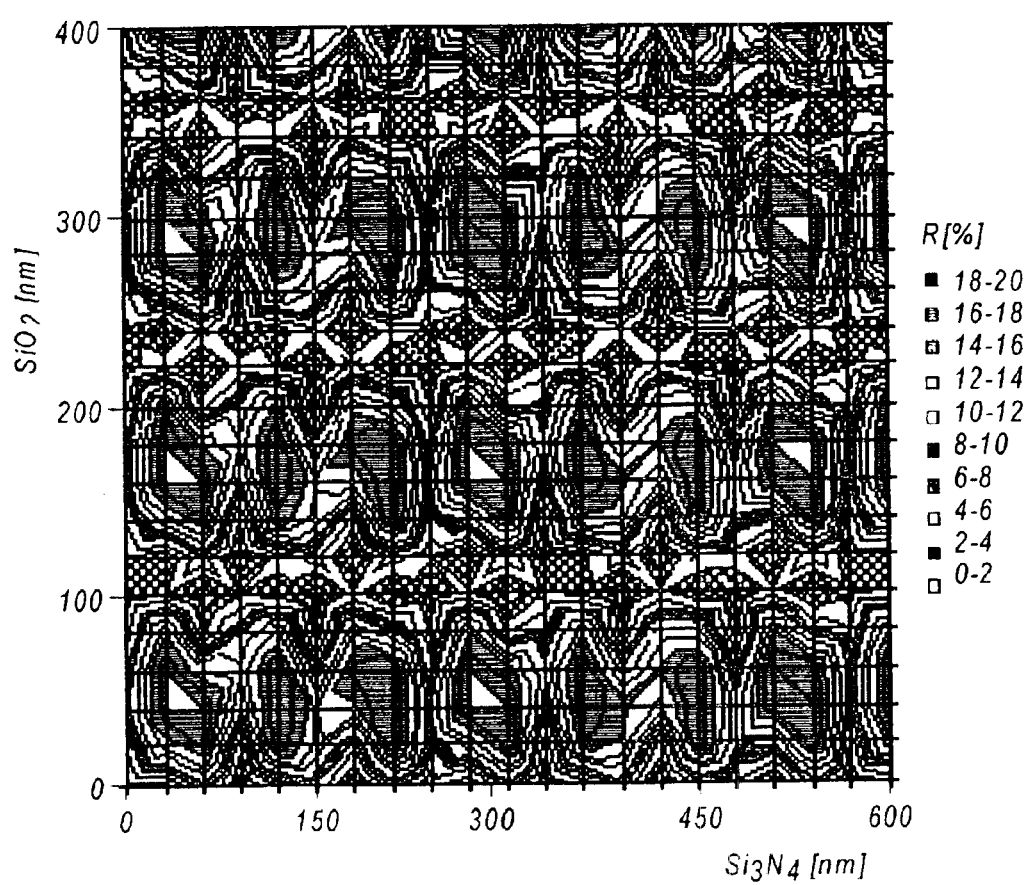
FIG. 2 is a graph showing the reflectivity of the passivation layer as a function of a plasmanitride ($Si_3N_4$) layer thickness (x-axis) and a plasmaoxide ($SiO_2$) layer thickness (y-axis)

FIG. 2 shows that the cause for these variations may easily be found in the strong dependence of reflectivity on the thickness of plasmanitride and plasmaoxide layers, which constitute a passivation layer in this embodiment. A fine-limbed structure of high and low reflectivity regions—including a periodic structure for any combination of plasmanitride and plasmaoxide layer thickness—renders a uniform process window impossible. For this embodiment passivation double layers with 500 nm of plasmanitride and 200 nm of plasmaoxide are used, but any other reasonable combination providing a similar result could be used. Thus, with the exception of refining the PECVD process of both layers, the method advantageously can solve this problem by compensating for the decreased exposure intensity at the outer wafer edge, which originally is due to the inherently lower reflectivity of the underlying passivation layer.

Figure 3:
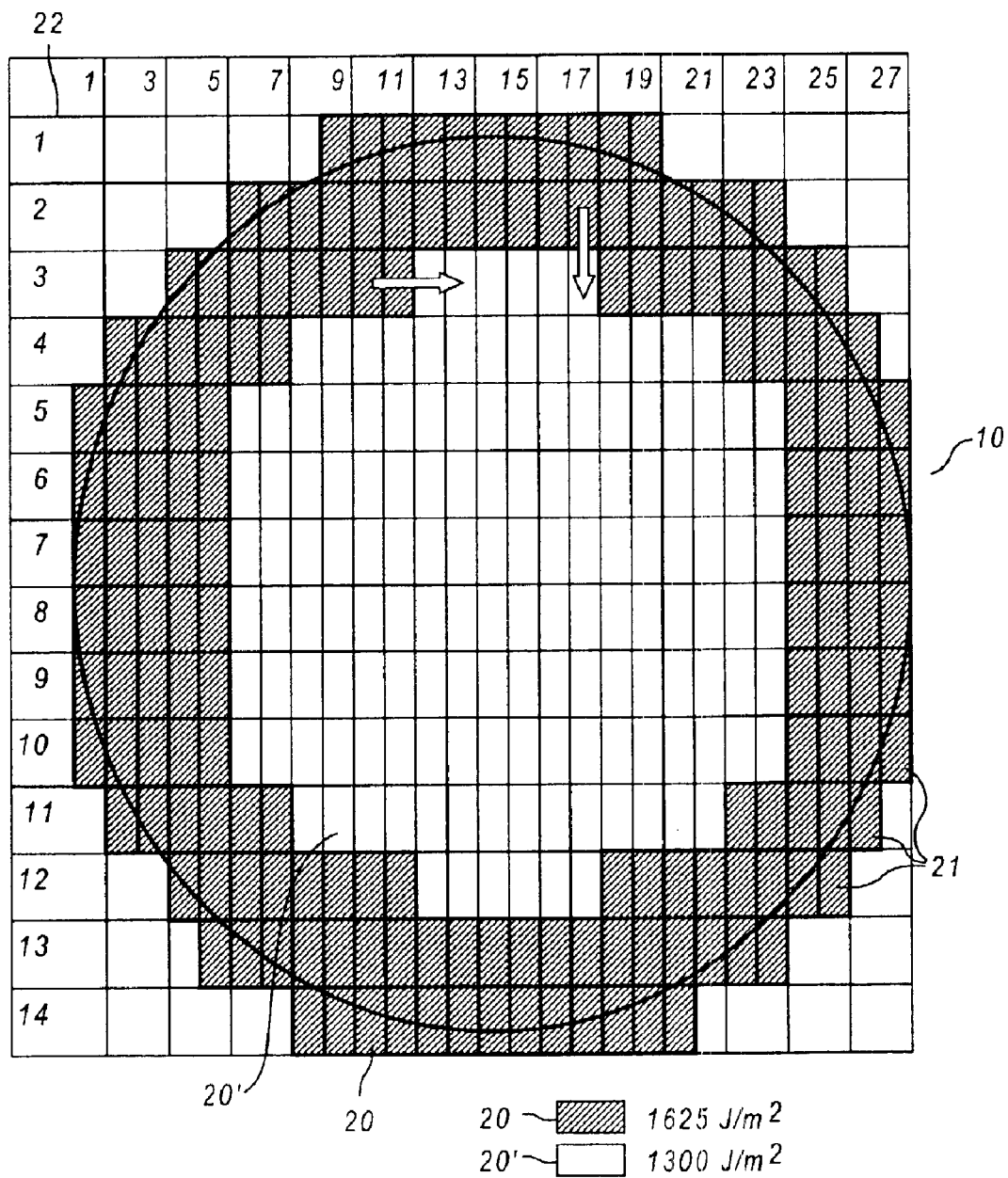
FIG. 3 is a litho-shot map of a wafer in which the exposure field matrix is divided into two areas for selective exposure.

Therefore, in a first step the matrix 22 of exposure fields 21, which will be projected onto wafer 10, are divided into two areas 20, 20' including a central circle area 20' for using conventional values for the exposure parameters of dose and focus, and an annular outer edge area 20 with an increased dose, but with the same focus. The resulting visualization of the wafer layout, called the litho-shot map, is shown in FIG. 3.

Figure 4:
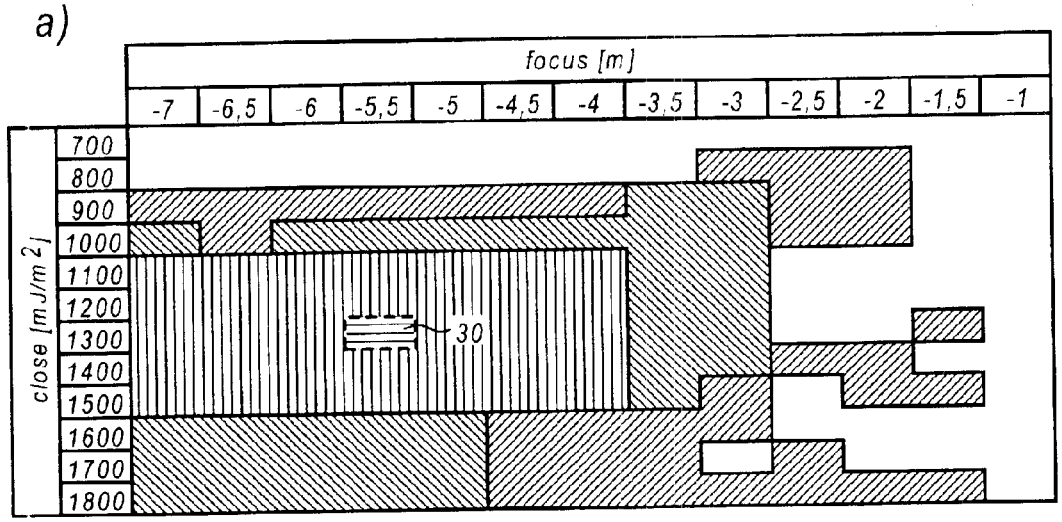
FIG. 4A shows an evaluation of two sets of exposure parameters, namely, the dose and the focus, for the inner circle area (a) and the outer edge area (b) displayed in FIG. 3.
FIG. 4B shows a process window and a scale used in FIGS. 4A and 4B.
Figure 4:
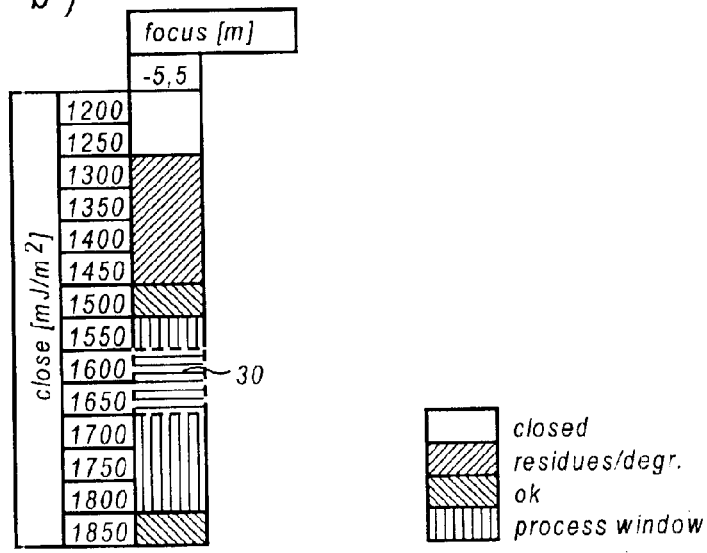

A detailed investigation for providing the exact values of the sets of exposure parameters could then be performed by varying the dose and focus inside each of the two areas 20, 20' in order to find the optimal process windows. The result of such an investigation can be seen in FIGS. 4A and 4B, where for each combination of dose and focus it is shown whether a quality measurement with a microscope reveals, that the corresponding fuses in the respective exposure fields are closed, show residues or degradation, are accessible for a laser spot or even can be associated with a stable process window. Having used various exposure parameters of the exposure fields of the inner circle area 20', a process window may be identified, which is shown in FIG. 4A. In this embodiment a combination of 1300 mJ/m$^2$ for the dose and −5.5 μm for the focus are chosen to expose exposure fields 21 in the inner circle area 20'. Having varied the dose parameter of the exposure fields 21 inside the outer edge area 20, a process window can be identified as well, which is shown in FIG. 4B. Here, the same focus parameter has been chosen as in the case of the inner circle area 20', since in this case there is less dependence on the location on the wafer. The microscope measurement of this first test wafer reveals an optimal dose of 1625 mJ/m$^2$ for the outer edge area 20.

Advantageously, this detailed identification of the process windows will only be carried out for wafer stepper set-ups, while the area maps and the exposure parameters dose and focus derived as mentioned can be used as defaults for routine use. Optimization can be achieved by investigating just a few single exposure fields along the border of both areas 20, 20', as indicated by the arrows in FIG. 3.

Figure 5:
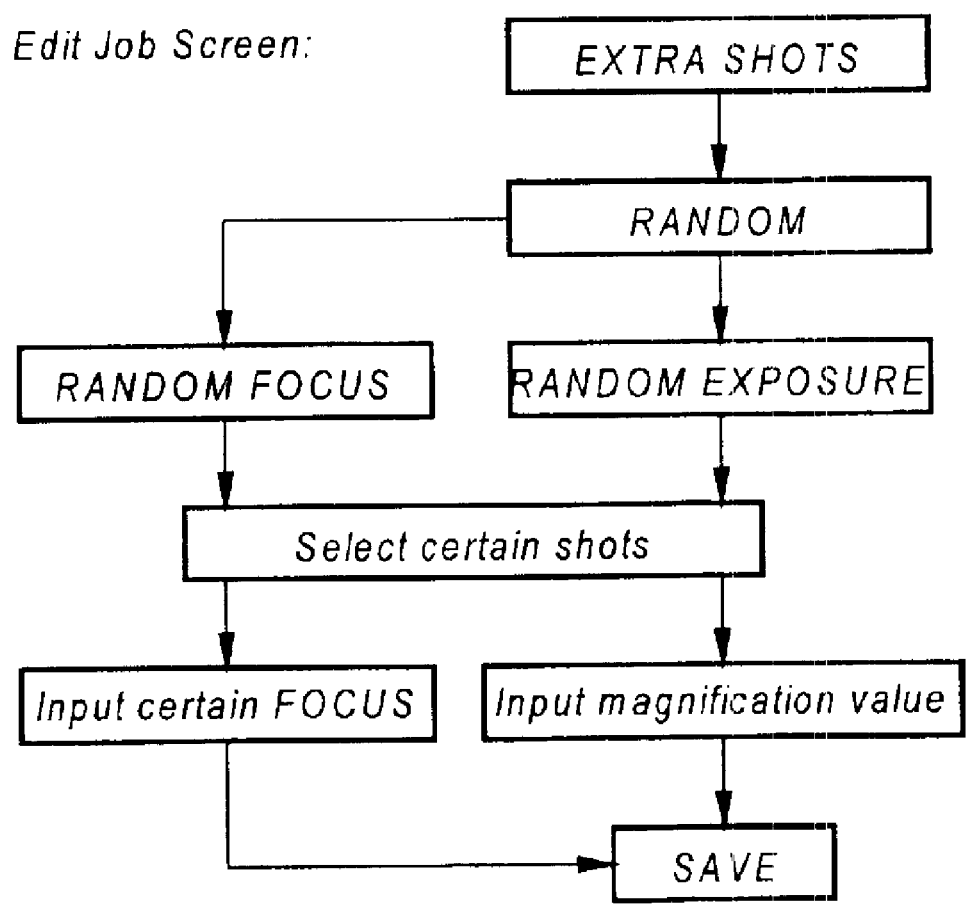
FIG. 5 is a flowchart showing the configuration flow of a Canon i5L wafer stepper prior to starting the wafer exposure.

With modern wafer steppers it has become possible to individually select exposure fields 21 and to change the focus or dose parameters, as can be seen in FIG. 5. There, a program menu is provided for configuration of the aforementioned facilities, which commonly has only been utilized for wafer stepper initializations.

In determining the area map and the set of exposure parameters, a test can be performed by comparing the images of fuses with neighboring exposure fields 21, which belong to different areas 20, 20'. In FIG. 6A, the fuses 80 advantageously reveal no resist residues since they have been exposed with a higher dose of 1625 $mJ/m^2$ because the exposure field belongs to the outer edge area 20 (row 3, column 11). FIG. 6B shows that the fuses 80 of the neighboring exposure field receiving the conventional dose of 1300 $mJ/m^2$ are also not covered by resist residues (row 3, column 12). Thus, the reflectivity variation across the wafer 10 is fully compensated in the transition region between the inner circle area 20' and the outer edge area 20, and no additional area or shifts of the borders between the two areas 20, 20' are necessary. If the microscope measurement would have revealed any resist residues on one side of the border, the border would have to be shifted into that direction, and reducing the radius of the inner circle area would have to be considered and vice versa. If there would be resist residues on fuses 80 on both sides of the border between the two areas 20, 20', a third annular area would have to be established between the two existing areas 20, 20'.

Having thus found the area maps by manufacturing a test wafer, the second step of the method is performed by using the resulting litho-shot map including the areas and their exposure fields with their exposure parameters to expose a plurality of wafers so long as the conditions are the same i.e., the pattern that will be projected, the tool that is used for depositing the plasmanitride and the plasmaoxide, and the wafer stepper that is used to expose the wafer.

Figure 7:
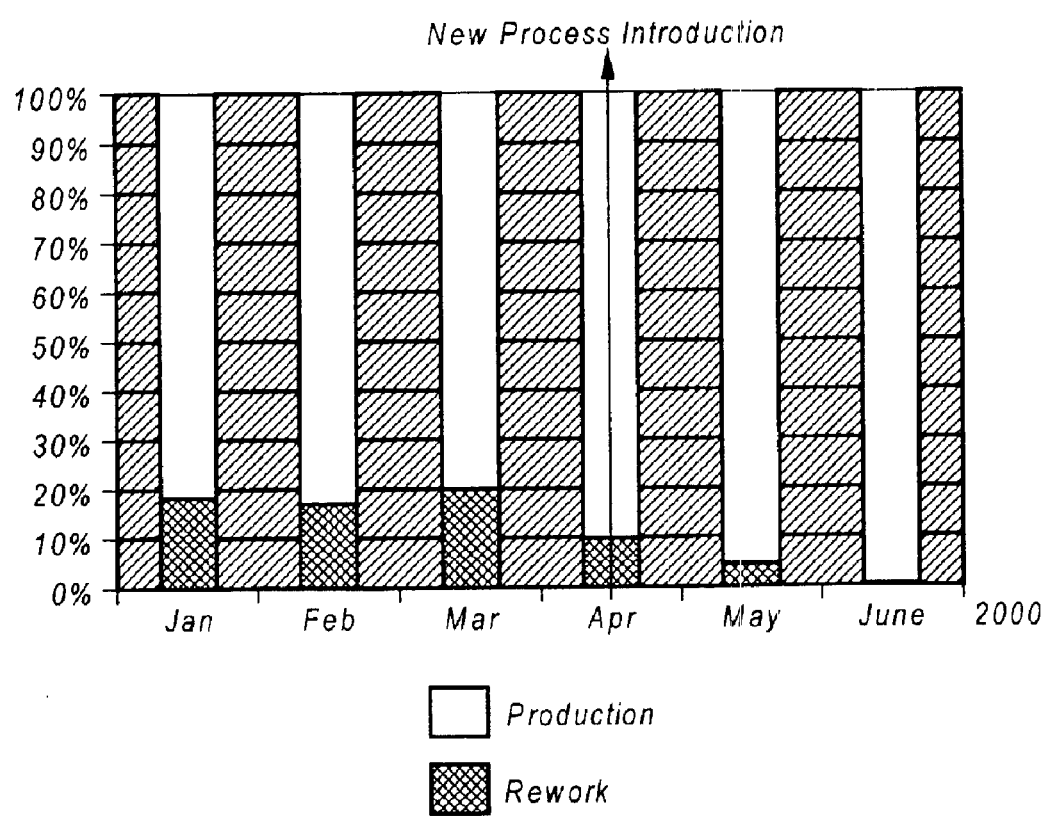
FIG. 7 is a graph showing the amount of rework in a test production from January 2000 to June 2000 with an arrow indicating the start of the inventive process.

Another advantage is, that since this method is only applied to change the exposure conditions of the exposure tool, there is no influence in the resist process, which might otherwise result in the requirement to change the corresponding process conditions. Due to the compensating effect for process inhomogeneities, since introducing the method into a test process environment in a 300 mm 64 M memory wafer manufacturing line, the amount of rework since mid-April 2000, has strongly decreased from about 20% before the introduction to about 1% in June 2000, which can be seen in FIG. 7.

Since the method is not restricted to memory products and 300 mm wafers, the method can advantageously be applied also in the manufacturing of other products having different diameters.

We claim:

1. A method for exposing a semiconductor wafer by adjusting exposure parameters of an exposure tool and projecting a pattern of a matrix configuration of exposure fields on the semiconductor wafer, the method which comprises:

in a first step, dividing the matrix configuration of exposure fields into at least two areas, providing a plurality of sets of exposure parameters including a dose and a focus of the exposure tool, and correlating each of the areas with a different one of the plurality of sets of exposure parameters;

in a second step, exposing each one of the exposure fields using a respective one of the plurality of sets of exposure parameters correlated with a respective one of the areas associated with the one of the exposure fields;

performing the first step and the second step on the semiconductor wafer, which has been coated with a passivation layer and a resist configured on the passivation layer; and providing each one of the plurality of sets of exposure parameters in accordance with a property of the passivation layer underlying the resist.

2. The method according to claim 1, which further comprises repeating the second step for a plurality of semiconductor wafers such that an extent and a design of the areas and the plurality of sets of exposure parameters respectively associated with the exposure fields are held constant for all of the plurality of semiconductor wafers.

3. The method according to claim 1, which further comprises performing the step of dividing the matrix configuration into the areas by:

first, determining for each one of the exposure fields, ranges of a multiplicity of sets of exposure parameters enabling an exposure to achieve a given quality; and second, associating each one of the exposure fields with a respective one of the areas such that all of the exposure parameters associated with the one of the exposure fields are within the ranges of the multiplicity of sets of exposure parameters.

4. The method according to claim 1, which further comprises providing the exposure tool as a wafer stepper or scanner.

5. The method according to claim 1, which further comprises providing the exposure tool as an electron beam lithography tool, a laser beam lithography tool, an ion projection beam lithography tool, or an x-ray lithography tool.

6. The method according to claim 1, which further comprises:

providing the areas as a continuous outer edge area and a continuous inner area of the semiconductor wafer;

providing a circle separating inner area ones of the exposure fields from outer area ones of the exposure fields; and providing the circle with an adjustable radius.

7. The method according to claim 1, which further comprises providing the semiconductor wafer with a diameter of at least 300 millimeters.

* * * * *